(12) United States Patent
Veendrick et al.

(10) Patent No.: US 8,390,331 B2
(45) Date of Patent: Mar. 5, 2013

(54) FLEXIBLE CMOS LIBRARY ARCHITECTURE FOR LEAKAGE POWER AND VARIABILITY REDUCTION

(75) Inventors: Hendricus Joseph Maria Veendrick, Heeze (NL); Leonardus Hendricus Maria Sevat, Veldhoven (NL)

(73) Assignee: NXP B.V., Eindhoven (NL)

( * ) Notice: Subject to any disclaimer, the term of this patent is extended or adjusted under 35 U.S.C. 154(b) by 233 days.

(21) Appl. No.: 12/648,880

(22) Filed: Dec. 29, 2009

(65) Prior Publication Data

US 2011/0156755 A1    Jun. 30, 2011

(51) Int. Cl.
*H03K 19/00* (2006.01)
*H01L 21/82* (2006.01)

(52) U.S. Cl. .................... 326/103; 326/41; 257/E21.602
(58) Field of Classification Search ........................ None
See application file for complete search history.

(56) References Cited

U.S. PATENT DOCUMENTS

| | | | |
|---|---|---|---|
| 3,601,627 A * | 8/1971 | Booher ........................... | 326/95 |
| 4,513,307 A | 4/1985 | Brown | |
| 4,623,911 A | 11/1986 | Pryor | |
| 5,387,810 A | 2/1995 | Seta et al. | |
| 5,459,340 A * | 10/1995 | Anderson et al. ............. | 257/203 |
| 5,492,857 A * | 2/1996 | Reedy et al. .................. | 438/407 |
| 5,818,090 A * | 10/1998 | Kimura .......................... | 257/369 |
| 6,275,064 B1 * | 8/2001 | Agrawal et al. ................. | 326/39 |
| 6,621,298 B2 * | 9/2003 | Agrawal et al. ................. | 326/50 |
| 6,872,991 B1 * | 3/2005 | Ngo et al. ...................... | 257/207 |
| 7,215,155 B2 | 5/2007 | Won | |
| 7,248,090 B2 | 7/2007 | Ramprasad | |
| 2002/0040987 A1 * | 4/2002 | Takahashi ..................... | 257/262 |
| 2010/0308329 A1 | 12/2010 | Benten et al. | |

FOREIGN PATENT DOCUMENTS

| | | |
|---|---|---|
| CN | 101925862 A | 12/2010 |
| EP | 0458244 A2 | 11/1991 |
| EP | 0782187 A1 | 7/1997 |
| GB | 2300983 A | 11/1996 |
| JP | 09-321146 | 12/1997 |

\* cited by examiner

*Primary Examiner* — Crystal L Hammond

(57) ABSTRACT

Various exemplary embodiments relate to improved fabrication of CMOS transistor arrays for integrated circuits. Increased regularity in standard-cells using gate-isolation architecture may permit further reduction in feature size. MOSFETs may be spaced at roughly equal pitch and have increased channel lengths for leakage current reduction. Logic gates may be designed to have nominal channel lengths for speed and increased channel lengths for leakage current reduction. Further leakage current reduction may involve specialized channel lengths for isolation MOSFETs. Thus, the combination of the gate-isolation technique with MOSFETs having lengthened channels that are evenly spaced at substantially the same pitch may produce a flexible library architecture for improved standard-cell designs in advanced CMOS technology nodes.

20 Claims, 4 Drawing Sheets

FLEXIBLE CMOS LIBRARY ARCHITECTURE FOR LEAKAGE POWER AND VARIABILITY REDUCTION

TECHNICAL FIELD

Various exemplary embodiments disclosed herein relate generally to the fabrication of integrated circuits.

BACKGROUND

The continuous scaling of the physical sizes and the operating voltage of semiconductor devices in integrated circuits has dramatically increased the impact of process variations on their performance and robustness of operation. At the same time, due to the scaling of the supply and threshold voltage, transistor leakage currents have increased dramatically. This rise in leakage current may be costly, creating a new need to cool both the integrated circuit (IC) chip and the overall system.

In a stable digital circuit, a Metal Oxide Semiconductor Field Effect Transistor (MOSFET) can only operate in two states. In the ON-state, the transistor exhibits a conductive connection between its source and drain. In the OFF-state, the transistor exhibits a resistive connection between its source and drain. The current that is flowing through the transistor in this OFF-state is usually referred to as the subthreshold leakage current. This leakage current is strongly related, in an exponential relationship, to the threshold voltage (Vt) of the transistor. In bulk Complementary Metal-Oxide-Semiconductor (CMOS) technologies, a 100 mV increase in Vt may lead to a subthreshold leakage reduction by a factor of 18.

The total power consumed by all OFF transistors on a chip is called the leakage power. In many applications, this leakage power consumption has reached unacceptably high levels. It may become a significant part of the total power consumed by an Integrated Circuit (IC). In the standby mode of battery-operated mobile devices, for example, almost all of the transistors are in the OFF state, so their combined leakage current limits the duration of the standby time.

Leakage current may occur in at least three ways during the OFF state.

First, a weak inversion current may appear between the source and drain in an MOS transistor occurs when gate voltage drops below Vt. The weak inversion current may be proportional to Vt, the thermal voltage, the gate oxide capacitance, the zero bias mobility, the maximum depletion layer width, the gate oxide thickness, and the capacitance of the depletion layer. Power dissipation by the IC may heat the transistors, thereby worsening this current due to its temperature dependence.

Second, gate-induced drain leakage may occur due to a high field-effect in the drain junction of the MOS transistor. Very high and abrupt drain doping may be used to minimize gate-induced drain leakage. However, such modifications may increase the cost of fabrication of the IC.

Third, punchthrough may happen when depletion regions from the drain-substrate and source-substrate junction extend into the channel. Additional implants may be used to control punchthrough. For example, a layer of higher doping at a depth equal to the bottom of the junction depletion regions could be added. Alternatively, a halo implant could be formed at the leading edges of the drain and source junctions. However, these techniques would tend to increase the IC's cost.

There are several well known leakage reduction techniques.

First, high Vt transistors may be used on certain paths. Such transistors can produce between one and two order of magnitude of reduction in the subthreshold leakage current. However, due to their reduced capability at driving currents, high Vt transistors increase the delay of logic gates. Thus, CMOS designs having at least two thresholds may only use high Vt transistors in logic gates for non timing-critical logic paths. Timing critical paths, in contrast, would use low Vt transistors.

Alternatively, low Vt transistors could be used in the core. In this case, a large high Vt transistor could be interposed between the core and the supply, thereby acting as a power switch. In the ON-state, the core could run at a high speed because it is built from low Vt transistors. In the OFF-state, the total core would have low leakage because leakage would be limited by the power switch.

CMOS library cells for the 90 nm CMOS technology node tended to have a rather irregular layout shape. Historically, leading semiconductor companies reached this level of CMOS technology in either 2002 or 2003. By 2009, such CMOS library cells have become obsolete for leading-edge chip products.

While still somewhat irregular, CMOS library cells for the 65 nm CMOS technology node were arranged in a more orderly manner. Intel, AMD, IBM, UMC, Chartered, and TSMC all produced 65 nm ICs by September of 2007. Because of lithographic requirements linked to the reduction from 90 nm to 65 nm, fabrication of such CMOS library cells could no longer be as irregular as for the 90 nm CMOS technology node. For example, the polysilicon tracks forming the transistor gates might need to be unidirectional. As a result, such CMOS library cells would exhibit an increase in library regularity compared to CMOS library cells that were used for the 90 nm CMOS technology node. Nevertheless, such CMOS library cells would not be sufficient regular to permit efficient lithography of these cells for CMOS technology nodes significantly smaller than the 65 nm CMOS technology mode.

Thus, it would be desirable to reduce leakage current from MOSFET arrays. In particular, it would be desirable to both reduce leakage current and feature size on a fabricated IC. Moreover, it would also be beneficial to provide logic gates in a more desirable pattern to promote more efficient fabrication of the ICs.

SUMMARY

In light of the present need for improved fabrication of ICs, a brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to a Complementary Metal-Oxide-Semiconductor (CMOS) cell library comprising: a first logic gate comprising MOSFETs with a first channel length; a second logic gate comprising MOSFETs with a second channel length, wherein the second channel length is substantially 1.5 times the first channel length and produces reduced leakage current in the second logic gate relative to the leakage current produced by the first logic gate; and pairs of isolation MOSFETs disposed both right and left of the first logic gate and the second logic gate, wherein centerlines of all MOSFETs are evenly spaced at substantially equal pitch.

Various exemplary embodiments relate to an Integrated Circuit (IC) device comprising: a substrate; a ground line; at least one power supply; and a first logic gate comprising MOSFETs with a first channel length; a second logic gate comprising MOSFETs with a second channel length, wherein the second channel length is may be between 1.1 and 2 times the first channel length and produces reduced leakage current in the second logic gate relative to the leakage current produced by the first logic gate; and pairs of isolation MOSFETs disposed both right and left of the first logic gate and the second logic gate, wherein centerlines of all MOSFETs are evenly spaced at substantially equal pitch.

Various exemplary embodiments relate to a method of fabricating Integrated Circuits (ICs) with Complementary Metal-Oxide-Semiconductor (CMOS) technology such that leakage current is minimized, the method comprising: fabricating a ground and at least one power supply on a substrate; fabricating a first logic gate comprising MOSFETs with a first channel length; fabricating a second logic gate comprising MOSFETs with a second channel length, wherein the second channel length is between 1.1 and 2 times the first channel length and produces reduced leakage current in the second logic gate relative to the leakage current produced by the first logic gate; and fabricating pairs of isolation MOSFETs disposed both right and left of the first logic gate and the second logic gate, wherein centerlines of all MOSFETs are evenly spaced at substantially equal pitch.

In various exemplary embodiments, the second channel length may be substantially 1.5 times the first channel length. The CMOS cell library or IC device may be used with CMOS technology nodes of 45 nm, 32 nm, or 22 nm. The pairs of isolation MOSFETs may have the second channel length. Alternatively, the pairs of isolation MOSFETs may have a third channel length that is greater than the second channel length It should be apparent that, in this manner, various exemplary embodiments enable reduction of leakage current and smaller feature size. In particular, various exemplary embodiments may provide such benefits by using long-channel transistors and gate-isolation techniques for fabrication of MOSFETs. Further, some embodiments provide with minimized leakage current and increased regularity between logic gates.

BRIEF DESCRIPTION OF THE DRAWINGS

In order to better understand various exemplary embodiments, reference is made to the accompanying drawings, wherein.

DETAILED DESCRIPTION

Figure 1:
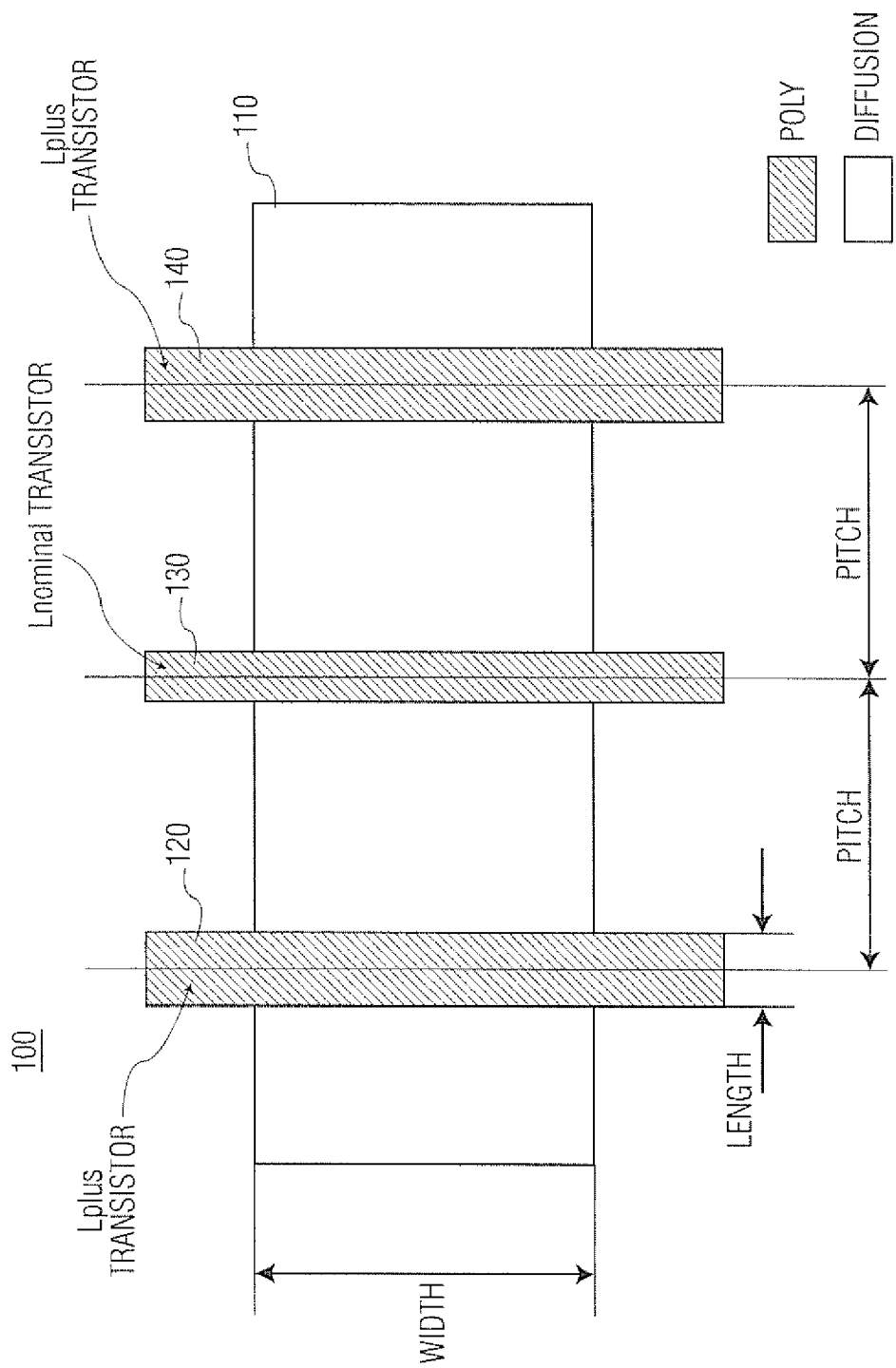
FIG. 1 illustrates an exemplary arrangement of three MOSFETs.

Referring now to the drawings, in which like numerals refer to like components or steps, there are disclosed broad aspects of various exemplary embodiments.

FIG. 1 illustrates an exemplary arrangement 100 of three MOSFETs 120, 130, and 140.

FIG. 1 provides an exemplary model of three MOSFETs 120, 130, and 140, explaining the applicability of the terms pitch, length, and width used elsewhere throughout this disclosure. During fabrication of an IC, diffusion area 110 is defined first. The width of diffusion area 110 defines the eventual width of all transistors created within diffusion area 110.

Next, "polysilicon" lines may be deposited onto diffusion area 110 to create MOSFETs. As will be apparent to those of ordinary skill in the art, the "polysilicon" lines may be made of metal instead. In such newer CMOS technology nodes, materials such as hafnium oxide ($HfO_2$) may be used to form the transistor gate isolation.

Every intersection of a "polysilicon" line with diffusion area 110 defines a MOSFET, regardless of whether the "polysilicon" line is actually made of metal, a stack of conductive layers or some other substance. The distance between the centerline of two "polysilicon" lines defines a term known as pitch. Here, the pitch between MOSFETs 120 and 130 is substantially the same as the pitch between MOSFETs 130 and 140.

The width of the "polysilicon" line defines the channel length of each MOSFET. Here, MOSFETs 120 and 140, known as Lplus transistors, have significantly greater lengths than MOSFET 130, known as a Lnominal transistor. In general, MOSFET 130 has greater leakage current and speed while MOSFETs 120 and 140 have reduced leakage current and speed. Thus, there may be a design trade-off between speed and leakage in selecting MOSFET length.

The relative length ratio between Lplus and Lnominal may vary depending upon desired leakage current, speed, and other parameters. In general, the ratio may vary between 1.1 and 2.0. For example, a ratio of 1.5 may be optimal for CMOS technology for the 45 nm node. Larger ratios may be necessary to further reduce leakage current for the 32 nm CMOS technology node and subsequent CMOS technology nodes.

Figure 2:
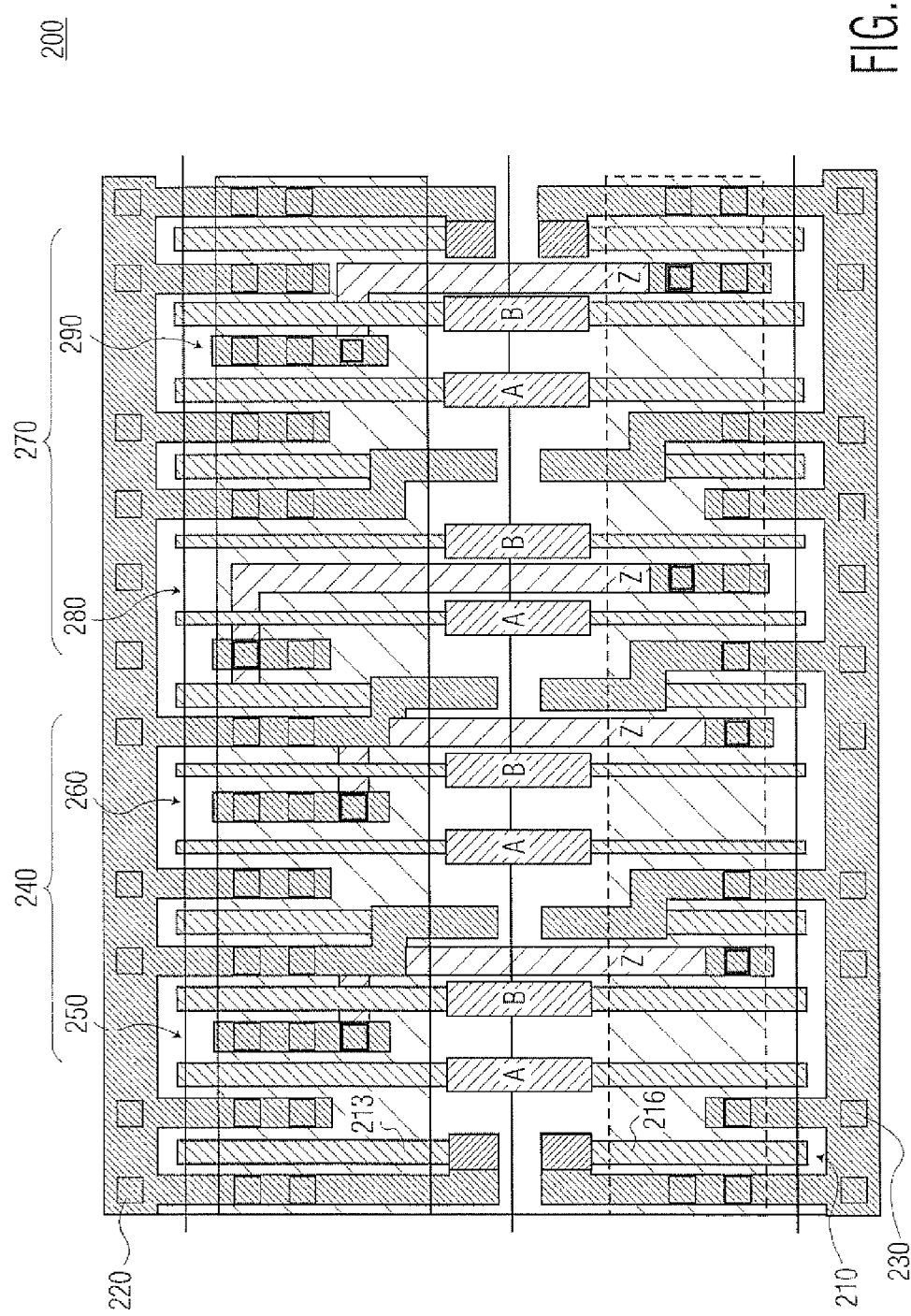
FIG. 2 illustrates a first exemplary architecture of a CMOS library comprising four logic gates.

FIG. 2 illustrates a first exemplary architecture of a CMOS library 200 comprising four logic gates.

CMOS cell library 200 may be used for semiconductor manufacturing processes requiring significant increases in library regularity. For example, CMOS cell library 200 could be used for the 45 nm CMOS technology node. Alternatively, with appropriate scaling, CMOS cell library 200 might be used for the 32 nm CMOS technology node and subsequent CMOS technology nodes, such as the 22, 16, or even 11 nm CMOS technology nodes, as described below.

For use of CMOS cell library 200 in the 45 nm CMOS technology node, increased regularity of standard cells may result in improved characteristics. Gate isolation architectures may involve regular spacing of MOSFETs that are switched off to isolate individual logic gates. Such architectures may be significantly smaller than conventional Shallow Trench Isolation (STI) and LOCal Oxidation of Silicon (LOCOS) architectures.

This gate isolation technique may not be used efficiently with conventional high Vt transistors. A high Vt mask pattern may require a relatively large overlap on both sides of the high Vt transistor. Thus, it may dramatically increase the transistor pitch and the overall silicon area.

Exemplary CMOS cell library 200 may also be used in the 32 nm CMOS technology node. New lithography imaging schemes may be needed. Fabrication of tight gate pitches might use split double patterning. Alternatively, single exposures could require higher-index immersion fluid and lens material. Carbon fullerene-based resist materials might be used to permit miniaturization of MOSFETs to the 32 nm CMOS technology node and beyond.

Exemplary CMOS cell library 200 could be used in the 22 nm CMOS technology node. In this node, water-immersion 193 nm scanners and double patterning may become obsolete. Thus, more mirrors may be added to the imaging lens. Multiple-e-beam maskless lithography may also be used. Copper damascene processes may optimize through-silicon via (TSV) manufacturing for the 22 nm CMOS technology node.

Exemplary CMOS cell library 200 may be used in the 16 nm CMOS technology node. New materials, such as strontium germanide (SrGe), may be used in this node. A SrGe layer may function as an interlayer in the silicon chip, boosting the current handling capabilities above the levels of standard semiconductors. A gate stack process may also occur, involving application of an aluminum oxide ($AlO_x$) cap to PMOS FETs and a lanthanum oxide ($LaO_x$) cap to NMOS FETs.

Exemplary CMOS cell library 200 may be used in the 11 nm CMOS technology node. New electronic design automation tools and special patterning may be needed to overcome the physical limitations of CMOS technology and conventional lithography. High-k dielectrics, such as materials based on $HfO_2$, may replace conventional silicon dioxide ($SiO_2$) gate dielectrics. Replacing the silicon dioxide gate dielectric with a high-k material may permit a thicker oxide layer to support a sufficient drive current that will allow MOSFETs to run at the same speed as for a thinner $SiO_2$ layer. Materials other than Si, such as indium gallium arsenide (InGaAs) or indium aluminum arsenide (InAlAs) may also be used to permit performance scaling to the 11 nm CMOS technology node.

Exemplary CMOS cell library 200, regardless of CMOS technology node, may comprise a plurality of pairs of isolation MOSFETs 210. In each pair of isolation MOSFETs 210, a PMOS FET 213, depicted in the upper half, may be coupled to a power supply line Vdd 220, while a NMOS FET 216, depicted in the lower half, may be coupled to ground line GND 230. Because PMOS FET 213 is coupled to Vdd 220 and NMOS FET 216 is coupled to GND 230, these MOSFETs 210 do not function as logic gates. Instead, pairs of isolation MOSFETs 210 may be disposed on either side of all logic gates, thereby functioning as gate isolators. Pairs of isolation MOSFETs 210 may be spaced at substantially the same pitch as the logic gates that may appear between any two pairs of isolation MOSFETs 210.

Isolation MOSFETs 210 may have a Lplus channel. As isolation MOSFETs 210 are not used in logic gates, it may be best to minimize their leakage current as operating speed is not a factor. In some embodiments, isolation MOSFETs 210 may have channel lengths greater than Lplus. Such embodiments would have three channel lengths: Lnominal, Lplus, and a third channel length for isolation MOSFETs that would provide the least leakage current as a trade-off based on speed would not be a factor in the fabrication of isolation MOSFETs 210.

In an exemplary pattern, the CMOS cell library 200 may comprise a first pair of logic gates 240 and a second pair of logic gates 270. The first pair of logic gates 240 may comprise a NAND gate 250 with a Lplus channel and a NAND gate 260 with a Lnominal channel. The second pair of logic gates 270 may comprise a NOR gate 280 with a Lnominal channel and a NAND gate 290 with a Lplus channel.

While exemplary CMOS cell library 200 may comprise four logic gates, other numbers of logic gates may occur, as will apparent to those having ordinary skill in the art. In addition, CMOS cell library 200 may include logic gates other than NAND and NOR gates, such as AND gates, OR gates, NOT gates (inverters), XOR gates, XNOR gates and flip-flops. Many variations are possible. For example, a complex library may consist of up to 1500 different CMOS library cells.

Exemplary NAND gate 250 and exemplary NAND gate 260 both have a first logical input A and a second logical input B. Output Z may appear on a metal line that is separate from the "polysilicon" line that crosses a diffusion area to define a MOSFET. As will be apparent to those of ordinary skill in the art, the metal line may be made of a conductive metal such as aluminum (Al) or copper (Cu).

In the master slice with exemplary NAND gate 250 and exemplary NAND gate 260, the distance between centerlines of the MOSFETs defines the pitch. Regardless of whether Lnominal or Lplus MOSFETs are used, the pitch may remain substantially the same. Therefore, this architecture may allow even mapping of both Lnominal standard cells and Lplus standard cells.

Lplus channel length may be between 1.1 and 2.0 times the Lnominal channel length. In general, channel length will be increased when leakage current reduction is emphasized and decreased when greater MOSFET speed becomes necessary. Thus, the ratio between Lplus and Lnominal may vary. In an exemplary embodiment, Lplus channel length may be roughly 1.5 times the Lnominal channel length.

NAND gate 250 may have MOSFETs with the Lplus channel length while NAND gate 260 may have the Lnominal channel length. Thus, NAND gate 250 may be optimized for reduction of leakage current, while NAND gate 260 may be optimized for faster operation. Because the pairs of isolation MOSFETs 210 never perform logical operations, they may also have the Lplus channel length, thereby reducing the subthreshold leakage current of the pairs of isolation MOSFETs 210. Alternatively, isolation MOSFETs 210 may have a third channel length, greater than Lplus.

The second pair of logic gates 270, as described above, may comprise a NOR gate 280 with a Lnominal channel length and a NAND gate 290 with a Lplus channel length. NOR gate 280 and NAND gate 290 may each have a first input terminal A, a second input terminal B, and an output terminal Z. However, as will be apparent to one having ordinary skill in the art, these teachings may be extended to other types of logic gates and logic gates that receive more than two input signals.

Like NAND gate 260, NOR gate 280 may have the Lnominal channel length. NAND gate 290 may resemble NAND gate 250, as both NAND gate 250 and NAND gate 290 have the Lplus channel length. All of these logic gates are evenly spaced by at a regular pitch, regardless of whether they are MOSFETs in logic gates or in isolation pair of MOSFETs 110.

In general, Lplus MOSFETs may provide significant advantages over conventional high Vt transistors. Unlike the high Vt transistors, Lplus MOSFETs do not require a relatively large overlap on both sides of the transistor. Therefore, Lplus MOSFETs can dramatically decrease both the transistor pitch and the silicon area.

Although Lplus MOSFETs may have 50% larger channel length than conventional transistors, they may only produce a 10% increase in transistor pitch. The impact may be even smaller for the MOSFETs in the core level, because Lplus transistors may increase gate utilization.

This architecture may be used in many applications. Fast design derivatives may be created as long as the total number of MOSFETs does not increase. Thus, there may be no need to have an entirely new design and floorplan.

Figure 3:
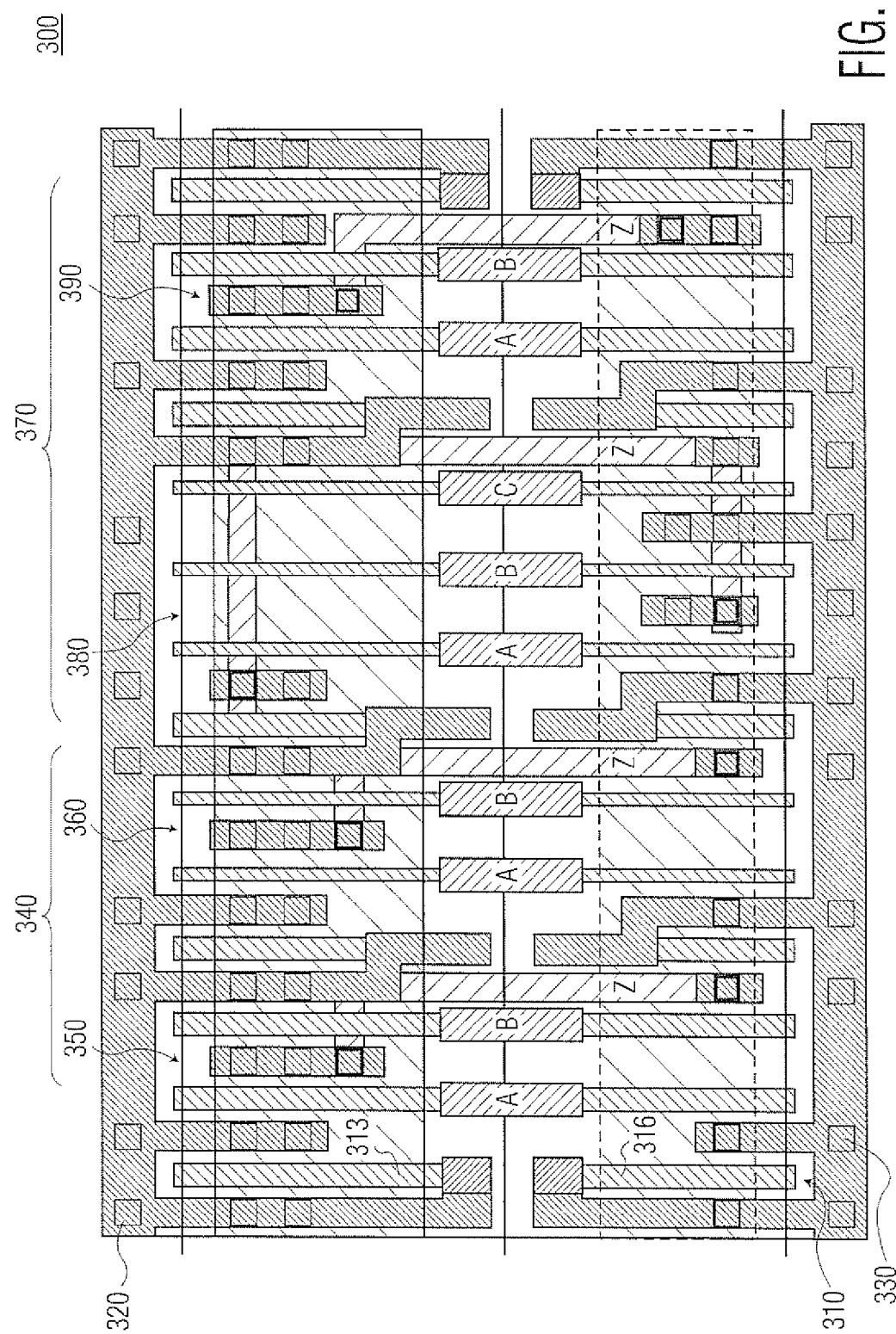
FIG. 3 illustrates a second exemplary architecture of a CMOS library comprising four logic gates.

FIG. 3 illustrates a second exemplary architecture of a CMOS library 300 comprising four logic gates.

Exemplary CMOS cell library 300, as described above for CMOS cell library 300, may use various CMOS technology nodes, such as 45 nm, 32 nm, 22 nm, 16 nm, and 11 nm. Regardless of the applicable CMOS technology node, CMOS cell library 300 may comprise a plurality of pairs of isolation MOSFETs 310. In each pair of isolation MOSFETs 310, a PMOS FET 313, depicted in the upper half, may be coupled to a power supply line Vdd 320, while a NMOS FET 316, depicted in the lower half, may be coupled to ground line GND 330. Because PMOS FET 313 is coupled to Vdd 320 and NMOS FET 316 is coupled to GND 330, these MOSFETs 310 do not function as logic gates. Instead, pairs of isolation MOSFETs 310 may be disposed on either side of all logic gates, thereby functioning as gate isolators. Pairs of isolation MOSFETs 310 may be spaced at substantially the same pitch as the logic gates that may appear between any two pairs of isolation MOSFETs 310.

In an exemplary pattern, the CMOS cell library 300 may comprise a first pair of logic gates 340 and a second pair of logic gates 370. The first pair of logic gates 340 may comprise a NAND gate 350 with a Lplus channel and a NAND gate 360 with a Lnominal channel. The second pair of logic gates 370 may comprise a three-input NOR gate 380 with a Lnominal channel and a NAND gate 390 with a Lplus channel.

Thus, CMOS cell library 300 differs from CMOS cell library 300 by using three-input NOR gate 380. This insertion of an extra input does not disrupt the regularity of the MOSFETs. As before, CMOS cell library 300 has all MOSFETs, whether used in pairs of isolation MOSFETs 310 or in logic gates spaced evenly at substantially regular intervals.

Figure 4:
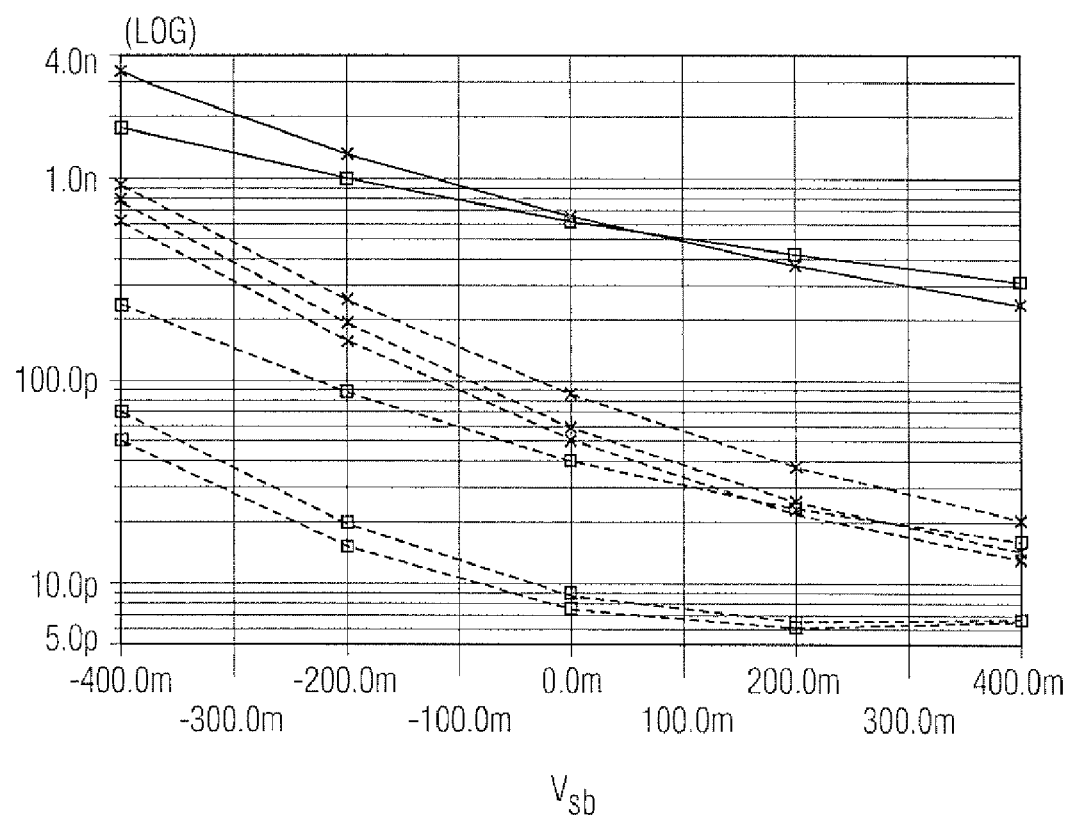
FIG. 4 illustrates an exemplary relationship between leakage current and well-bias voltage.

FIG. 4 illustrates an exemplary relationship between leakage current and well-bias voltage.

As depicted in FIG. 4, leakage current ($Id_{off}$) and well bias voltage ($V_{ab}$) vary for NMOS FETs and PMOS FETs. This variance is proportional to different values of the channel length (L). An increase in the channel length from 40 nm to 60 nm for a L-plus transistor may lead to a reduction of between 5 and 10 in leakage current at zero well-bias voltage. Such an increase may be exemplary for a 45 nm CMOS process.

Such reduction in leakage current may be comparable to an expected reduction achieved by the conventional technique of using high Vt transistors. However, Lplus transistors may permit smaller areas to be used than high Vt transistors. In addition, Lplus transistors may show reduced sensitivity to process parameter spread. Thus, circuits and systems built with Lplus transistors may be easier to mass produce. Furthermore, Lplus transistors may be less expensive, as fabrication of high Vt transistors may require a costly additional mask step.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A Complementary Metal-Oxide-Semiconductor (CMOS) cell library comprising:
a first logic gate comprising MOS Field Effect Transistors (MOSFETs) with a first channel length;
a second logic gate comprising MOSFETs with a second channel length, wherein the second channel length is between 1.1 and 2 times the first channel length and produces reduced leakage current in the second logic gate relative to a leakage current produced by the first logic gate; and
pairs of isolation MOSFETs disposed both right and left of the first logic gate and the second logic gate, wherein centerlines of all MOSFETs are evenly spaced at substantially equal pitch.

2. The CMOS cell library of claim 1, wherein the second channel length is substantially 1.5 times the first channel length.

3. The CMOS cell library of claim 1, wherein the CMOS cell library is used with a 45 nm CMOS technology node.

4. The CMOS cell library of claim 3, wherein the CMOS cell library is used with a 32 nm CMOS technology node.

5. The CMOS cell library of claim 4, wherein the CMOS cell library is used with a 22 nm CMOS technology node.

6. The CMOS cell library of claim 1, wherein the pairs of isolation MOSFETs have the second channel length.

7. The CMOS cell library of claim 1, wherein the pairs of isolation MOSFETs have a third channel length and the third channel length is greater than the second channel length.

8. An Integrated Circuit (IC) device comprising:
a substrate;
a ground line;
at least one power supply; and
a first logic gate comprising Complementary Metal Oxide Semiconductor Field Effect Transistors (MOSFETs) with a first channel length;
a second logic gate comprising Complementary MOSFETs with a second channel length, wherein the second channel length is between 1.1 and 2 times the first channel length and produces reduced leakage current in the second logic gate relative to a leakage current produced by the first logic gate; and
pairs of isolation MOSFETs disposed both right and left of the first logic gate and the second logic gate, wherein centerlines of all MOSFETs are evenly spaced at substantially equal pitch.

9. The IC device of claim 8, wherein the second channel length is substantially 1.5 times the first channel length.

10. The IC device of claim 8, wherein the IC device is used with a 45 nm CMOS technology node.

11. The IC device of claim 10, wherein the IC device is used with a 32 nm CMOS technology node.

12. The IC device of claim 11, wherein the IC device is used with a 22 nm CMOS technology node.

13. The IC device of claim 8, wherein the pairs of isolation MOSFETs have the second channel length.

14. The IC device of claim 8, wherein the pairs of isolation MOSFETs have a third channel length and the third channel length is greater than the second channel length.

15. A method of fabricating a CMOS cell library with Complementary Metal-Oxide-Semiconductor (CMOS) technology such that leakage current is minimized, the method comprising:
fabricating a ground and at least one power supply on a substrate;
fabricating a first logic gate comprising MOS Field Effect Transistors (MOSFETs) with a first channel length;
fabricating a second logic gate comprising MOSFETs a second channel length, wherein the second channel length is between 1.1 and 2 times the first channel length and produces reduced leakage current in the second logic gate relative to a leakage current produced by the first logic gate; and fabricating pairs of isolation MOSFETs disposed both right and left of the first logic gate and the second logic gate, wherein centerlines of all MOSFETs are evenly spaced at substantially equal pitch.

16. The method of claim 15, wherein the CMOS cell library is used with a 45 nm CMOS technology node.

17. The method of claim 16, wherein the CMOS cell library is used with a 32 nm CMOS technology node.

18. The method of claim 17, wherein the CMOS cell library is used with a 22 nm CMOS technology node.

19. The method of claim 15, wherein the pairs of isolation MOSFETs have the second channel length.

20. The method of claim 15, wherein the pairs of isolation MOSFETs have a third channel length and the third channel length is greater than the second channel length.

* * * * *